US006353083B1

(12) United States Patent
Inbasekaran et al.

(10) Patent No.: US 6,353,083 B1
(45) Date of Patent: Mar. 5, 2002

(54) FLUORENE COPOLYMERS AND DEVICES MADE THEREFROM

(75) Inventors: Michael Inbasekaran; Weishi Wu; Edmund P. Woo; Mark T. Bernius, all of Midland, MI (US)

(73) Assignee: The Dow Chemical Company, Midland, MI (US)

( * ) Notice: Subject to any disclaimer, the term of this patent is extended or adjusted under 35 U.S.C. 154(b) by 0 days.

(21) Appl. No.: 09/289,344

(22) Filed: Apr. 9, 1999

Related U.S. Application Data
(60) Provisional application No. 60/118,799, filed on Feb. 4, 1999.

(51) Int. Cl.$^7$ ................................................ C08F 61/60

(52) U.S. Cl. ........................ 528/295; 528/298; 528/308; 528/331; 528/344

(58) Field of Search ................................ 528/362, 330, 528/331, 344, 289, 294, 295, 298, 308; 313/504, 506, 507; 252/301.16; 428/690, 691, 917, 421, 457

(56) References Cited

U.S. PATENT DOCUMENTS

| | | | |
|---|---|---|---|
| 3,641,115 A | 2/1972 | Peck et al. | 260/475 |
| 4,769,292 A | 9/1988 | Tang et al. | 428/690 |
| 5,247,190 A | 9/1993 | Friend et al. | 257/40 |
| 5,621,131 A | 4/1997 | Kreuder et al. | 558/46 |
| 5,679,760 A | 10/1997 | Mullen et al. | 528/220 |
| 5,682,043 A | 10/1997 | Pei et al. | 257/40 |
| 5,708,130 A | 1/1998 | Woo et al. | 528/397 |
| 5,728,801 A | 3/1998 | Wu et al. | 528/422 |
| 5,777,070 A | 7/1998 | Inbasekaran et al. | 528/394 |
| 5,807,974 A * | 9/1998 | Kim et al. | 528/366 |
| 5,876,864 A | 3/1999 | Kim et al. | 428/690 |
| 5,998,045 A * | 12/1999 | Weidong et al. | 428/690 |
| 6,169,163 B1 * | 1/2001 | Woo et al. | 528/397 |

FOREIGN PATENT DOCUMENTS

| | | |
|---|---|---|
| FR | 2702870 | 9/1994 |
| WO | Wo 97/33193 | 9/1997 |
| WO | Wo 97/33323 | 9/1997 |
| WO | WO 97/39045 | 10/1997 |
| WO | WO 97/39082 | 10/1997 |
| WO | WO 97/46052 | 12/1997 |

OTHER PUBLICATIONS

Adachi, C. et al., "Blue light–emitting organic electroluminescent devices," *Applied Physics Letters*, vol. 56, No. 9, pp. 799–801, Feb. 26, 1990.
Bernius, M. et al., "Fluorene–Based Polymers—Preparation and Applications," *J. of Mat. Sci.*, Jan. 5, 1999.
Bradley, D. D. C. et al., "Electro–Optic Properties of Precursor Route Poly(arylene vinylene) Polymers," *Springer Series in Solid–State Sciences*, vol. 107, pp. 304–309, 1992.

Grice, A. W. et al., "High brightness and efficiency blue light–emitting polymer diodes," *Applied Physics Letters*, vol. 73, No. 5, pp. 629–631, Aug. 3, 1998.
Pai, D. M. et al., "Trap–Controlled Hopping Transport," *J. Phys. Chem.*, vol. 88, pp. 4714–4717, 1984.
Redecker, M. et al., "Nondispersive hole transport in an electoluminescent polyfluorene," *Applied Physics Letters*, vol. 73, No. 11, pp. 1565–1567, Sep. 14, 1998.
Woo, E. et al., "Highly Efficient LEDs based on Fluorene Polymers," MRS Meeting Presentation, Apr. 13, 1998.
U.S. application No. 08/861469 filed on May 21, 1997.
U.S. application No. 09/063615 filed on Apr. 21, 1998.
Braun, D. et al., *Appl. Phys. Lett.*, vol. 58, No. 18, pp. 1982–1984, 1991.
Brown, C., *Journal of Polymer Science: Polymer Chemistry Edition*, vol. 24, pp. 255–267, 1986.
Burroughes, J. H. et al., *Nature*, vol. 347, pp. 539–541, 1990.
Burrows et al., *Applied Physics Letters*, vol. 64, pp. 2718–2720, May 16, 1994.
Cho et al., *Advanced Materials*, vol. 9, No. 4, pp. 326–328, 1997.
Cho et al., *Macromol. Symp.*, vol. 125, pp. 133–142, 1997.
Derwent 94–307586/38 (JP06234668–A) p. 119, week 9438.
Fuji et al., *Jpn. J. Appl. Phys.*, vol. 34, pp. 499–502, 1995.
Fukuda et al., *Japanese Journal of Applied Physics*, vol. 28, No. 8, pp. 1433–1435, 1989.
Fukuda et al., *Journal of Polymer Science: Part A: Polymer Chemistry*, vol. 31, pp. 2465–2471, 1993.
Ghera et al., *Journal of American Chemical Society*, vol. 82, pp. 4945–4952, 1960.
Grem, G. et al., *Advanced Materials*, vol. 4, pp. 36–37, 1992.
Hamada et al., *Chemistry Letters*, pp. 905–906, 1993.
Hamada et al., *Optoelectronics–Devices and Technologies*, vol. 7, No. 1, pp. 83–93, Jun. 1992.
Kido et al., *Chemistry Letters*, pp. 47–48 (1996).
Kim et al., *Polym. Prepr.*, vol. 38, No. 1, pp. 417–418 (1997).
Li et al., *Jounal of Chemical Society Comm.*, pp. 2211–2212 (1995).
O'Brien et al., *Synthetic Metals*, vol. 76, pp. 105–108 (1996).
Remmers et al., *Macromolecular Rapid Communications*, vol. 17, pp. 239–252 (1996).
Sheats et al., *Science*, vol. 273, pp. 884–888 (Aug. 16, 1996).

(List continued on next page.)

*Primary Examiner*—David W. Wu
*Assistant Examiner*—R Harlan

(57) ABSTRACT

This invention relates to: (a) fluorene copolymers comprising at least 10% (by residual monomeric units) of 9-substituted and/or 9,9-disubstituted fluorene moieties and at least two other monomeric units containing delocalized p-electrons, (b) polymer blends comprising at least 10 weight % of a copolymer specified in (a), and (c) electronic devices (such as polymer light emitting diodes) containing one or more films derived from these copolymers.

12 Claims, No Drawings

OTHER PUBLICATIONS

Strukelj et al., *Science,* vol. 267, pp. 1969–1972 (Mar. 31, 1995).

Wallow et al., *Journal of Organic Chemistry,* vol. 59, pp. 5034–5037 (1994).

Weaver et al., *Thin Solid Films,* vol. 273, pp. 39–47 (1996).

Yamamoto et al., *Japan Journal of Applied Physics,* vol. 33, pp. L250–L253 (Feb. 1994).

Yamamoto, *Progress in Polymer Science,* vol. 17, pp. 1153–1205 (1992).

Yang et al., *Journal of Applied Physics,* vol. 77, No. 9, pp. 4807–4809 (1995).

Yoshida et al., *Applied Physics Letters,* vol. 69, No. 6, pp. 734–736 (Aug. 5, 1996).

Kido, J. et al., *Appl. Phys. Lett.,* vol. 67, No. 16, pp. 2281–2283, 1995.

Larmat, F. et al., *Amer. Chem Soc.,* vol. 37, No. 1, pp. 799–800, 1997.

Le Deit, H. et al., *Synthetic Matels,* No. 47, pp. 373–376, 1992.

Ohmori et al., *Jpn. J. of Appl. Phys.,* vol. 30, No. 11B, pp. 1941–1943, 1991.

Ohmori et al, *J. Phys. D: Appl. Phys.,* vol. 29, pp. 2983–2987, 1996.

Ohmori et al., *Jpn. J. Appl. Phys.,* vol. 32, No. 11B, pp. 1663–1666, 1993.

Ohmori et al., *Jpn. J. appl. Phys.,* vol. 30, No. 11B, pp. 1938–1940, 1991.

Tang et al., *J. Appl. Phys,* vol. 65, No. 9, pp. 3610–3616, 1989.

Tang et al., *Appl. Phys. Lett.,* vol. 51, No. 12, pp. 913–915, 1987.

Uchida et al., *Jpn. J. Appl. Phys,* vol. 32, pp. 921–924, 1993.

Wu et al., *Appl. Phys. Lett.,* vol. 66, No. 6, pp. 653–655, 1995.

Yang et al., *J. Appl. Phys.,* vol. 81, No. 7, pp. 3294–3298, 1997.

* cited by examiner

FLUORENE COPOLYMERS AND DEVICES MADE THEREFROM

This application claims benefit of Prov. No. 60/118,799 filed Feb. 4, 1999.

This invention relates to fluorene copolymers, polymer blends comprising such copolymers, and electronic devices (such as polymer light emitting diodes) containing one or more films derived from these copolymers.

Conjugated polymers may exhibit the optical and electronic properties of inorganic semiconductors because of the presence of delocalized p-electrons. Poly(9,9-disubstituted-fluorene-2,7-diyls) constitute a family of semiconducting polymers with advantageous features. Their aromatic backbone is resistant to chemical and photochemical degradation; the biphenylene unit of each fluorene monomer is locked into a planar-like configuration by the C9 atom; substituents on C9 may be chosen to modify physical and chemical properties without introducing torsional strain between adjacent fluorene units which would otherwise be disruptive to delocalization of the p-system. Indeed, poly(9, 9-di-n-octylfluorene-2,7-diyl) of U.S. Pat. No. 5,708,130 (herein fully incorporated by reference) has been shown to be an effective emitter for a blue light emitting diode (LED) (Grice, et.al Applied Physics Letters, Vol. 73, 1998, p 629–631) and to exhibit high carrier mobility, a very desirable feature for electronic devices (Redecker, et. al Applied Physics Letters, Vol. 73, 1998, pp. 1565–1567) each of which are fully incorporated herein by reference.

A means to further modify their optical and electronic properties is desired in order to broaden the applicability of these fluorene polymers in electronic devices. In this context, optical properties of a polymer include its absorption and photoluminescence spectra and electronic properties include ionization potential, electron affinity, band gap and carrier transport and mobility. U.S. patent application Ser. No. 08/861,469 filed May 21, 1997, U.S. Pat. No. 6,169,163 (herein fully incorporated by reference) teaches a way for property modification via fluorene copolymers each containing 9,9-disubstituted fluorene and another comonomer. For instance, copolymers comprising fluorene and aromatic amines have lower (closer to vacuum level) ionization potential and preferential hole transporting properties, and copolymers with cyano-containing moieties have higher electron affinity and preferential electron transporting properties relative to fluorene homopolymers.

Many electronic applications require the active material to exhibit both hole transporting and electron transporting properties. To maximize the efficiency of a LED, for example, the polymer should ideally transport both holes and electrons equally well (Bradley et. al, in Springer Series in Solid State Sciences, Vol 107, Springer-Verlag Berlin Heidelberg, 1992, pp. 304–309). The copolymers of U.S. patent application Ser. No. 08/861,469 filed May 21, 1997, herein fully incorporated by reference, comprising a fluorene moiety and one other comonomer cannot meet this requirement; therefore, there is a need for further improvement.

This invention relates to copolymers of 9-substituted and/or 9,9-disubstituted fluorene moieties and at least two other comonomers containing delocalized p-electrons. Preferably, at least 10% of the total monomeric units of these copolymers are selected from 9-substituted- and/or 9,9-disubstituted fluorenes; more preferably at least 15% of the monomeric units of these copolymers are selected from 9-substituted- and/or 9,9-disubstituted fluorenes; and most preferably at least 20% of the monomeric units of these copolymers are selected from 9-substituted- and/or 9,9-disubstituted fluorenes. Each copolymer contains two or more non-fluorene comonomers in any proportion. These copolymers are characterized by their excellent solubility (>1 g/L) in common organic solvents, ability to form pinhole free films and weight-average molecular weight of at least 3000 gram/mole relative to polystyrene standard, preferably at least 10,000 gram/mole, most preferably at least 20,000 gram/mole. They are further characterized by a polydispersity of less than 10, preferably less than 5, most preferably less than 3. These copolymers exhibit photoluminescent emission in the range of 350 nm to 1,000 nm and absorption from 200 nm to 600 nm. The copolymers of this invention are useful as the active components in electronic devices including light emitting diodes, photocells, photoconductors, and field effect transistors.

This invention relates to fluorene copolymers and electronic devices comprising a film of such copolymers. The subject copolymers comprise at least 10%, based on residual monomeric units (RMU), of 9-substituted and/or 9,9-disubstituted fluorene moieties represented by structures I and II respectively. A residual monomeric unit is the portion of the monomer that is incorporated into the polymer backbone. For instance, 1,4-phenylene is the residual monomeric unit of 1,4-difunctional-benzene monomers irrespective of the chemical nature of the functional groups.

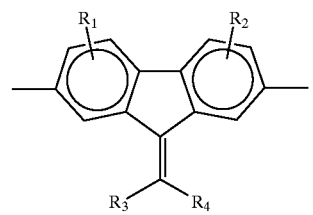

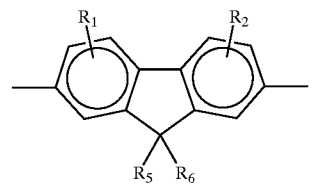

In structures I and II, $R_1$ and $R_2$ are independently in each occurence hydrogen, $C_{1-20}$ hydrocarbyl, $C_{1-20}$ hydrocarbyloxy, $C_{1-20}$ thiohydrocarbyloxy, or cyano. $R_1$ and $R_2$ are independently in each occurrence preferably hydrogen, $C_{1-20}$ alkyl, $C_{6-10}$ aryl or alkyl-substituted aryl, $C_{6-10}$ aryloxy or alkyl-substituted aryloxy, $C_{1-12}$ alkoxy/thioalkoxy, and cyano. Even more preferably $R_1$ and $R_2$ are independently in each occurrence hydrogen, $C_{1-10}$ alkyl, phenyl, and cyano. $R_3$ and R4 are independently in each occurrence a hydrogen, $C_{1-20}$ hydrocarby optionally substituted with $C_{1-20}$ alkoxy/aryloxy, thioalkoxy/thioaryloxy, secondary/tertiary amines, hydroxy, carboxylic/sulfonic acids, cyano, and esters; $C_{6-20}$ aryl optionally substituted with $C_{1-20}$ alkoxy/aryloxy, thioalkoxy/thioaryloxy, secondary/tertiary amines, hydroxy, carboxylic/sulfonic acids, cyano, and esters. $R_3$ and $R_4$ may also form $C_{3-12}$ cyclic structures with the olefin carbon (structure I) to which they are attached, said cyclic structures may further contain one or more heteroatoms such as phosphorus, sulfur, oxygen and nitrogen. Preferably $R_3$ and $R_4$ are independently in each occurrence a hydrogen, $C_{1-12}$ alkyl optionally substituted with $C_{1-12}$ alkoxy/aryloxy, thioalkoxy/thioaryloxy, secondary/tertiary amines, hydroxy, carboxylic/sulfonic acids, cyano and esters; $C_{6-20}$ aryl optionally substituted with $C_{1-12}$ alkoxy/aryloxy, thioalkoxy/thioaryloxy, secondary/tertiary amines, hydroxy, carboxylic/sulfonic acids, cyano, and esters. Most preferably $R_3$ and $R_4$ are independently in each occurrence a hydrogen, $C_{1-8}$ alkyl optionally substituted with $C_{1-10}$ alkoxy/aryloxy, thioalkoxy/thioaryloxy, secondary/tertiary amines, hydroxy, carboxylic/sulfonic acids, cyano, and esters; $C_{6-12}$ aryl optionally substituted with $C_{1-10}$ alkoxy/aryloxy, thioalkoxy/thioaryloxy, secondary/tertiary amines, hydroxy, carboxylic/sulfonic acids, cyano, and esters. $R_5$ and $R_6$ are independently in each occurrence a hydrogen, $C_{1-20}$ hydrocarby optionally substituted with $C_{1-20}$ alkoxy/aryloxy, thioalkoxy/thioaryloxy, secondary/tertiary amines, hydroxy, carboxylic/sulfonic acids, cyano, and esters; $C_{6-20}$ aryl optionally substituted with $C_{1-20}$ alkoxy/aryloxy, thioalkoxy/thioaryloxy, secondary/tertiary amines, hydroxy, carboxylic/sulfonic acids, cyano, and esters. $R_5$ and $R_6$ may also form $C_{3-12}$ cyclic structures with the C-9 carbon of fluorene (structure II), said cyclic structures may further contain one or more heteroatoms such as phosphorus, sulfur, oxygen and nitrogen. Preferably $R_5$ and $R_6$ are independently in each occurrence a hydrogen, $C_{1-12}$ alkyl optionally substituted with $C_{1-12}$ alkoxy/aryloxy, thioalkoxy/thioaryloxy, secondary/tertiary amines, hydroxy, carboxylic/sulfonic acids, cyano and esters; $C_{6-20}$ aryl optionally substituted with $C_{1-12}$ alkoxy/aryloxy, thioalkoxy/thioaryloxy, secondary/tertiary amines, hydroxy, carboxylic/sulfonic acids, cyano, and esters. Most preferably $R_5$ and $R_6$ are independently in each occurrence a hydrogen, $C_{1-8}$ alkyl optionally substituted with $C_{1-10}$ alkoxy/aryloxy, thioalkoxy/thioaryloxy, secondary/tertiary amines, hydroxy, carboxylic/sulfonic acids, cyano, and esters; $C_{6-12}$ aryl optionally substituted with $C_{1-10}$ alkoxy/aryloxy, thioalkoxy/thioaryloxy, secondary/tertiary amines, hydroxy, carboxylic/sulfonic acids, cyano, and esters. These copolymers are characterized by their excellent solubility (>1 g/L) in common organic solvents, ability to form pin-hole free films and weight-average molecular weight of at least 3,000 gram/mole relative to polystyrene standard, preferably at least 10,000 gram/mole, most preferably at least 20,000 grain/mole. They are further characterized by a polydispersity of less than 10, preferably less than 5, most preferably less than 3. These copolymers exhibit photoluminescent emission in the range of 350 nm to 1,000 nm and absorption from 200 nm to 600 nm. The copolymers of this invention are useful as the active components in electronic devices including light emitting diodes, photocells, photoconductors, and field effect transistors.

In the first embodiment, the copolymers of the invention comprise at least 10% RMU of structures I and/or II and at least 1% of two or more RMUs possessing hole transporting property. Hole transporting property is imparted to a polymer by electron-rich RMUs. Examples include those derived from stilbenes or 1,4-dienes without electron-withdrawing substituents, tertiary amines, N,N,N',N'-tetraaryl-1,4-diaminobenzene, N,N,N',N'-tetraarylbenzidine, N-substituted-carbazoles, diarylsilanes, and thiophenes/furans/pyrroles without electron-withdrawing substitutents. These hole transporting RMUs may bear a variety of substituents so long as their presence do not significantly affect hole transporting properties adversely. Preferred substituents are $C_{1-20}$ alkyls, $C_{6-20}$ aryls and alkylaryls optionally substituted with $C_{1-6}$ alkoxys and $C_{6-12}$ aryloxys. Particularly effective are RMUs derived from tertiary aromatic amines, N,N,N',N'-tetraaryl-1,4-diaminobenzene N,N,N',N'-tetraarylbenzidine, thiophene, and bithiophene. Preferably the copolymers comprise at least 15% of RMUs of structures I and/or II, and at least 10% of two or more hole transporting RMUs. Most preferably the copolymers comprise at least 20% of RMUs of structures I and/or II and at least 20% of two or more RMUs possessing hole transporting property. The ratio of I to II may vary without limit and similarly the ratio of various hole transporting RMUs can vary without limit so long as the combined percentage in the copolymer remains within the specified range. With respect to the hole transporting RMUs in the copolymers of the invention, there is no restriction that they must all belong to the same chemical type. A copolymer of the invention may, for example, contain RMUs of the silanyl type, RMUs of the thiophene type and RMUs of the tertiary amine type.

In the second embodiment the copolymers of the invention comprise at least 10% of RMUs of structures I and II and at least 1% of two or more RMUs possessing electron transporting property. Electron transporting property is imparted to polymers by electron-deficient RMUs. Examples include RMUs containing electron-withdrawing groups such as F, cyano, sulfonyl, carbonyl, nitro, carboxy; moieties containing imine linkage, and condensed polycyclic aromatics. Condensed polycyclic aromatics include acenaphthene, phenanthrene, anthracene, fluoranthene, pyrene, perylene, rubrene, chrysene, and corene. Five-membered heterocylces containing imine linkages include oxazoles/isoxazoles, N-substituted-imidazoles/pyrazoles, thiazole/isothiazole, oxadiazoles, and N-substituted-triazoles. Six-membered heterocycles containing imine linkages include pyridines, pyridazines, pyrimidines, pyrazines, triazines, and tetrazenes. Benzo-fused heterocycles containing imine linkages include benzoxazoles, benzothiazole, benzimidazoles, quinoline, isoquinolines, cinnolines, quinazolines, quinoxalines, phthalazines, benzothiadiazoles, benzotriazines, phenazines, phenanthridines, and, acridines. More complex RMUs include 1,4-tetrafluorophenylene, 1,4'-octafluorobiphenylene, 1,4-cyanophenylene, 1,4-dicyanophenylene, and

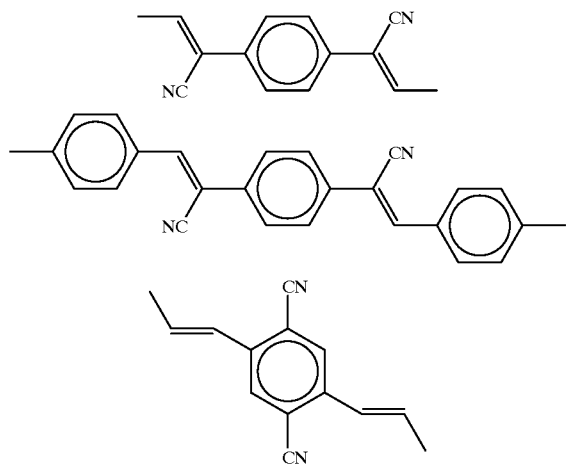

-continued

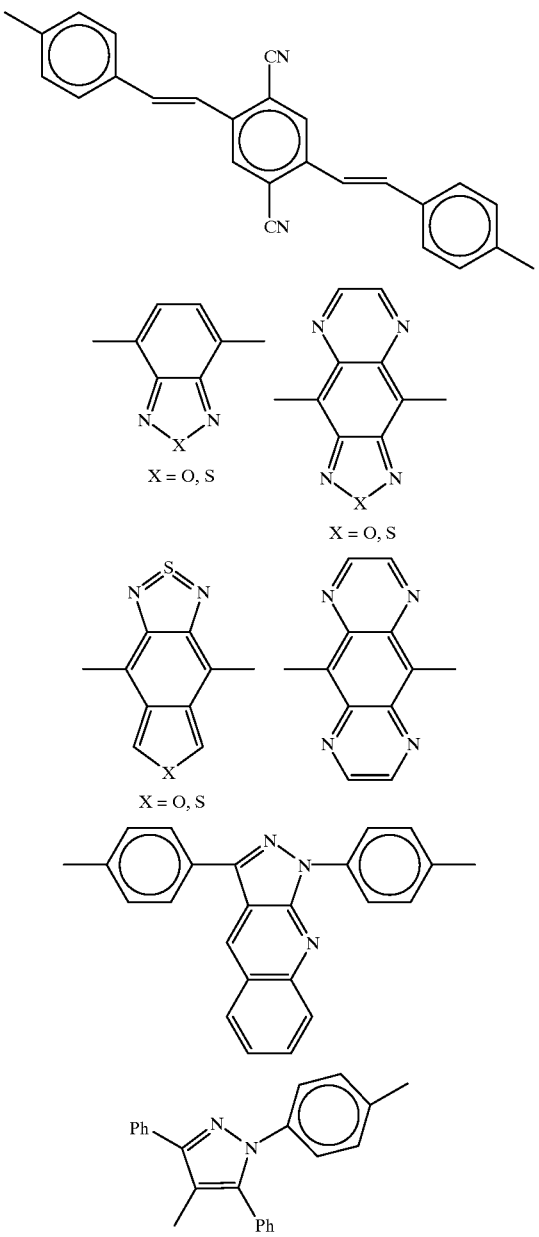

These electron transporting RMUs may bear a variety of substituents so long as their presence does not significantly affect electron transporting properties adversely. Preferred substituents are $C_{1-20}$ alkyls, $C_{6-20}$ aryls and alkylaryls optionally substituted with $C_{1-6}$ alkoxys and $C_{6-12}$ aryloxys. Particularly effective are RMUs derived from perfluorobiphenyl, quinoxalines, cyano-substituted olefins, oxadiazole, and benzothiadiazoles. Preferably the copolymers comprise at least 15% of RMUs of structures I and/or II, and at least 10% of two or more of the exemplified electron transporting RMUs. Most preferably the copolymers comprise at least 20% of RMUs of structures I and/or II and at least 20% of two or more of the exemplified electron transporting RMUs. The ratio of I to II can vary without limit and similarly the ratio of various electron transporting RMUs may vary without limit so long as the combined percentage in the copolymer remains within the specified range. With respect to the electron transporting RMUs in the copolymers of the invention, there is no restriction that they must all belong to the same chemical type. A copolymer of the invention may, for example, contain RMUs of the cyano-olefin type, RMUs of the oxadiazole type and RMUs of the condensed polynuclear aromatic type.

In the third embodiment, copolymers of the invention comprise at least 10% of RMUs of structures I and/or II and at least 1% of one or more hole transporting RMUs and at least 1% of one or more electron-transporting RMUs. Hole transporting RMUs and electron transporting RMUs are selected from among those already defined above. More preferably copolymers of this embodiment comprise at least 15% of RMUs of structures I and/or II and at least 5% of one or more hole transporting RMUs and at least 5% of one or more electron-transporting RMUs. Most preferably copolymers of this embodiment comprise at least 20% of RMUs of structures I and/or II and at least 10% of one or more hole transporting RMUs and at least 10% of one or more electron-transporting RMUs. The ratio of I to II can vary without limit and similarly the ratio of various hole transporting RMUs may vary without limit so long as the combined percentage in the copolymer remains within the specified range. With respect to the hole transporting RMUs in the copolymers of the invention, there is no restriction that they must all belong to the same chemical type. A copolymer of the invention may, for example, contain RMUs of the silanyl type, RMUs of the thiophene type and RMUs of the tertiary amine type. Similarly, with respect to the electron transporting RMUs in the copolymers of the invention, there is no restriction that they must all belong to the same chemical type. A copolymer of the invention may, for example, contain RMUs of the cyano-olefin type, RMUs of the oxadiazole type and RMUs of the condensed polynuclear aromatic type.

In the fourth embodiment, copolymers of the invention comprise at least 10% of RMUs of structures I and/or II, at least 1% of one or more RMUs derived independently in each occurrence from benzene, naphthalene, and biphenylene optionally substituted with $C_{1-12}$ alkyl/alkoxy and $C_{6-10}$ aryl/aryloxy (hereinafter referred to as arylene RMUs), and at least 1% of one or more RMUs selected from among the hole transporting and electron transporting RMUs defined above. Preferably copolymers of this embodiment comprise at least 15% of RMUs of structures I and/or II, at least 5% of one or more arylene RMUs, and at least 1% of one or more RMUs selected from among the hole transporting and electron transporting RMUs defined above. Most preferably copolymers of this embodiment comprise at least 20% of RMUs of structures I and/or II, at least 10% of one or more arylene RMUs, and at least 5% of one or more RMUs selected from among the hole transporting and electron transporting RMUs defined above. The ratio of I to II can vary without limit and similarly the ratio of various arylene RMUs may vary without limit so long as the combined percentage in the copolymer remains within the specified range. Incorporation of arylene RMUs can lead to modifications in the thermal, optical and electronic properties of the copolymers.

The fifth embodiment relates to blends of two or more of the copolymers of the invention without limits on relative proportions of the individual components. Such blends may be prepared by solution blending, or blending in the melt state.

The sixth embodiment relates to blends containing at least 0.1 weight % of at least one copolymer of the invention with at least one of the fluorene homopolymers or copolymers disclosed in U.S. Pat. Nos. 5,708,130, 5,777,070, and U.S.

application Ser. No. 08/861,469. Such blends may be prepared by solution blending, or blending in the melt state.

The seventh embodiment relates to blends containing at least 0.1 weight % of at least one copolymer of the invention with at least one other non-fluorene polymer, e.g., polystyrene, polyethylene, poly(methyl methacrylate), polysulfones, polycarbonates, and polylurethanes. Such blends may be prepared by solution blending, or blending in the melt state.

The eighth embodiment relates to a film containing at least 0.1 weight % of at least one copolymer of the invention.

The ninth embodiment of the invention relates to light emitting diodes comprising one or more of the copolymers of the invention wherein the copolymers are present as single-layer films or as multiple-layer films, whose combined thickness is in the range of 10 nm to 1000 nm, preferably in the range of 25 nm to 500 nm, most preferably in the range of 50 nm to 300 nm. The copolymer films may be formed by solvent-based processing techniques such as spin-coating, roller-coating, dip-coating, spray-coating, and doctor-blading. When two or more copolymers are used, they may be deposited separately as distinct layers or deposited as one layer from a solution containing a blend of the desired copolymers. An organic light emitting diode typically consists of an organic film sandwiched between an anode and a cathode, such that when a positive bias is applied to the device, holes are injected into the organic film from the anode and electrons are injected into the organic film from the cathode. The combination of a hole and an electron may give rise to an exciton which may undergo radiative decay to the ground state by releasing a photon. The anode and the cathode may be made of any materials and in any structure known in the art. The anode is preferably transparent. A mixed oxide of tin and indium (ITO) is useful as the anode due to its conductivity and transparency. ITO is deposited on a transparent substrate such as glass or plastic so that the light emitted by the organic film may be observed. The organic film may be the composite of several individual layers or may be the blend of several materials each designed for a specific function. The cathode is commonly a metallic film deposited on the surface of the organic film by either evaporation or sputtering.

The tenth embodiment of the invention relates to photocells comprising one or more of the copolymers of the invention wherein the copolymers are present as single-layer fins or as multiple-layer films, whose combined thickness is in the range of 10 nm to 1000 nm, preferably in the range of 25 nm to 500 nm, most preferably in the range of 50 nm to 300 nm. The copolymer films may be formed by solvent-based processing techniques such as spin-coating, roller-coating, dip-coating, spray-coating and doctor-blading. When two or more copolymers are used, they may be deposited separately as distinct layers or deposited as one layer from a solution containing a blend of the desired copolymers. By photocells is meant a class of optoelectronic devices which can convert incident light energy into electrical energy. Examples of photocells are photovoltaic devices, solar cells, photodiodes, and photodetectors. A photocell generally comprises a transparent or semi-transparent first electrode deposited on a transparent substrate. A polymer film is then formed onto the first electrode which is, in turn, coated by a second electrode. Incident light transmitted through the substrate and the first electrode is converted by the polymer film into excitons which can dissociate into electrons and holes under the appropriate circumstances, thus generating an electric current.

The eleventh embodiment of the invention relates to metal-insulator-semiconductor field effect transistors comprising one or more of the copolymers of the invention (serving as the semiconducting polymer) deposited onto an insulator wherein the copolymers are present as single-layer films or as multiple-layer films whose combined thickness is in the range of 10 nm to 1000 nm, preferably in the range of 25 nm to 500 nm, most preferably in the range of 50 nm to 300 nm. The copolymer films may be formed by solvent-based processing techniques such as spin-coating, roller-coating, dip-coating, spray-coating and doctor-blading. When two or more copolymers are used, they may be deposited separately as distinct layers or deposited as one layer from a solution containing a blend of the desired copolymers. Two electrodes (source and drain) are attached to the semiconducting polymer and a third electrode (gate) onto the opposite surface of the insulator. If the semiconducting polymer is hole transporting (i.e., the majority carriers are positive holes), then applying a negative DC voltage to the gate electrode induces an accumulation of holes near the polymer-insulator interface, creating a conduction channel through which electric current can flow between the source and the drain. The transistor is in the "on" state. Reversing the gate voltage causes a depletion of holes in the accumulation zone and cessation of current. The transistor is in the "off" state. If the semiconducting polymer is electron transporting (i.e., the majority carriers are electrons), then applying a positive DC voltage to the gate electrode induces a deficiency of holes (accumulation of electrons) near the polymer-insulator interface, creating a conduction channel through which electric current can flow between the source and the drain.

The copolymers of instant invention may be prepared by a variety of polycondensation processes. Particularly effective are those processes involving coupling of aromatic/vinylic/acetylenic monomers catalyzed by transition metals such as nickel and palladium.

Coupling of aryl and vinyl halides with zerovalent nickel was reported by Semmelhack et. al., (J. Am. Chem. Soc., Vol. 103, 1981, p. 6460–6471) herein fully incorporated by reference. Coupling of aryl halides and other heteroaromatic halides with zerovalent nickel was discussed by Yamamoto et. al., (Macromolecules, Vol. 25, 1992, p. 1214–1223) herein fully incorporated by reference. These procedures require a large excess of the air and moisture sensitive zerovalent nickel. A variant that requires a truly catalytic amount of nickel but a large excess of zinc as the reducing agent was first reported by Colon et. al., (J. Polym. Sci., Polym. Chem., Vol. 28, 1990, p. 367–383), herein fully incorporated by reference, and later applied successfully to fully conjugated polymers by Ueda et. al., (Macromolecules, Vol. 24, 1991, p. 2694–2697), herein fully incorporated by reference, represents an improvement with respect to experimental handling. In these procedures, mixtures of monomers each bearing two halogen substituents (preferably bromine and chlorine) can be polymerized into copolymers of essentially random nature if the monomers are of about the same reactivity. If reactivities are significantly different, then the more reactive monomers would be polymerized preferentially over the less reactive ones. The result would be a somewhat "blocky" copolymer of uncertain structure and order. An additional disadvantage of these procedures is the presence of large amounts of metallic reagents which must often be thoroughly removed from the resulting copolymers to avoid the deleterious effects they can have on electronic device performance.

Coupling reactions catalyzed by palladium are usually more preferred as the amount of palladium required is truly catalytic and the structure and order of the resulting copolymers are more predictable. Chen et. al., (Macromolecules, Vol. 26, 1993, p. 3462–3463), herein fully incorporated by reference, produced regiospecific polythiophenes by palladium catalyzed coupling of 2-bromo-5-(bromozinco) alkylthiophenes. The obtained molecular weights were very low, however. Coupling of aryl halides with acetylenes catalyzed by palladium was successfully used for producing copolymers by Yamamoto et. al., (Macromolecules, Vol. 27, 1994, p. 6620–6626), herein fully incorporated by reference, and coupling of aryl halides with olefins similarly employed for polymerization by Greiner et. al., (Macromol. Chem. Phys., Vol. 197, 1996, p. 113–134) herein fully incorporated by reference.

A preferred condensation reaction involves the coupling of organoboron compounds with organohalides as taught by Miyaura and Suzuki (Chemical Reviews, Vol. 95, 1995, p. 2457–2483) herein fully incorporated by reference. This reaction has been adapted with improvement to the production of high molecular weight polymers by Inbasekaran et. al., as reported in U.S. Pat. No. 5,777,070, herein incorporated in its entirety by reference. Polymerization is effected by reacting a near equimolar mixture of an aromatic/vinylic diboronic acid/ester (hereinafter referred to as type A monomer) and an aromatic/vinylic dibromide (hereinafter referred to as type B monomer). Two or more type A monomers and two or more type B monomers may be used so long as the combine molar amounts of A's are approximately equal to that of B's. A unique feature of copolymers from this process is the order which results from the fact that chain growth takes place exclusively via the formation of A-B dyads as each type A monomer can only react with a type B monomer. Monomers of more complex structures may be advantageously employed to yield copolymers of even higher degree of structural order. For example, an appropriately functionalized electron transporting RMU may be reacted with two molecules of a hole transporting moiety to yield a new monomer of the structure Br-HTRMU-ETRMU-HTRMU-Br, where HTRMU sand ETRMU stand for hole transporting RMU and electron transporting RMU respectively.

The following specific embodiments are given to illustrate the invention and should not be interpreted as limiting in any way.

All inherent viscosity measurements were determined on THF solutions (0.5 g/dL) at 25° C. and are expressed in unit of dL/gram. The formulas of the monomers used are given below.

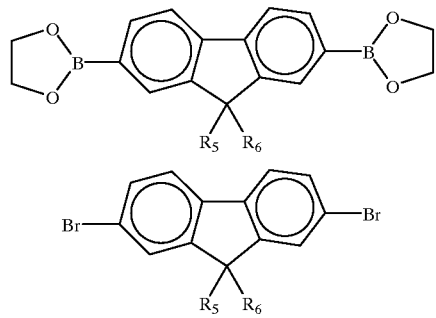

1a, $R_5=R_6$=n-butyl
1b, $R_5=R_6$=n-hexyl
1c, $R_5=R_6$=n-octyl
1d, $R_5=R_6$=2-ethylhexyl
1e, $R_5=R_6$=n-undecyl
1f, $R_5=R_6$=n-dodecyl
2b, $R_5=R_6$=n-hexyl
2c, $R_5=R_6$=n-octyl
2d, $R_5=R_6$=2-ethylhexyl

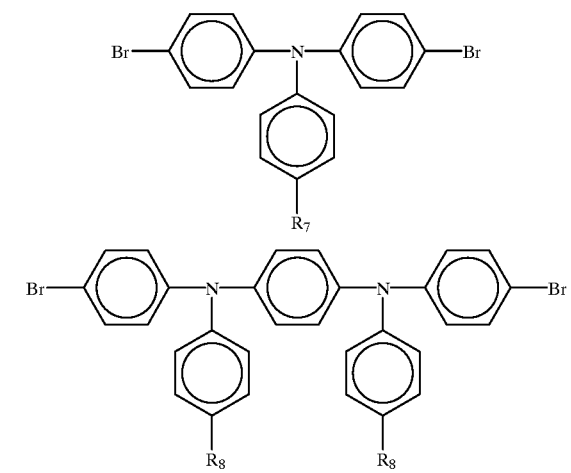

3a, $R_7$=sec-butyl
3b, $R_7$=methoxy
4a, $R_7$=methyl
4b, $R_7$=methoxy

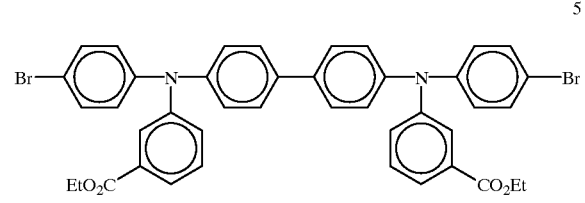

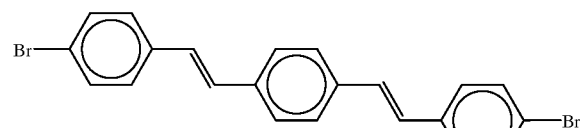

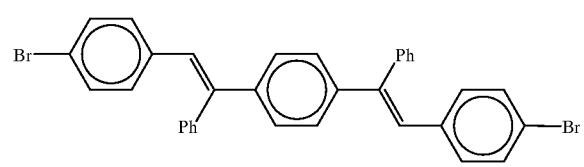

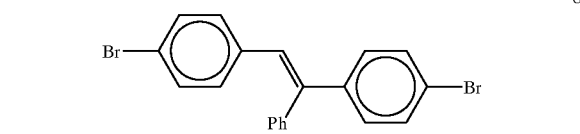

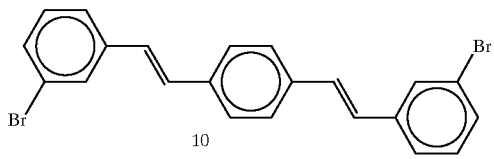

10

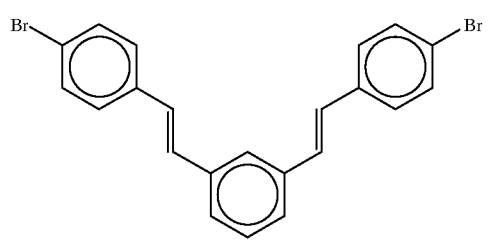

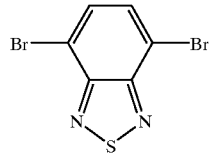

11

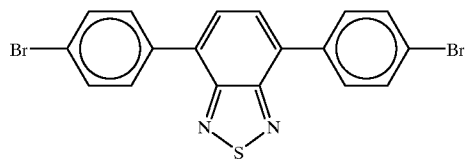

12

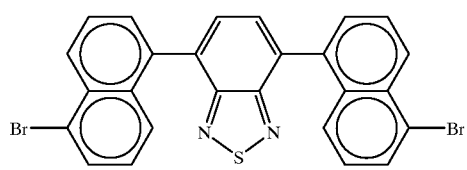

13

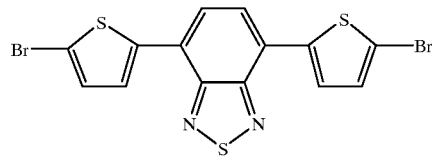

14

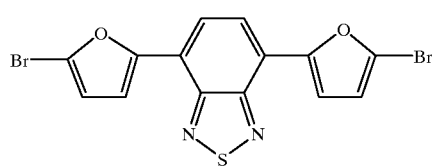

15

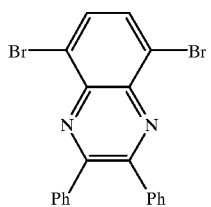

16

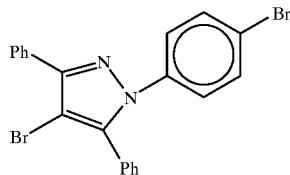

17

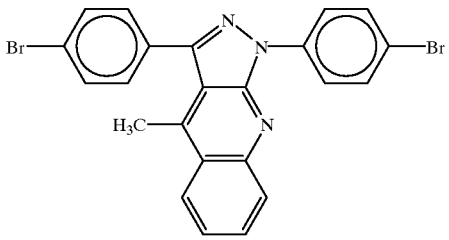

18

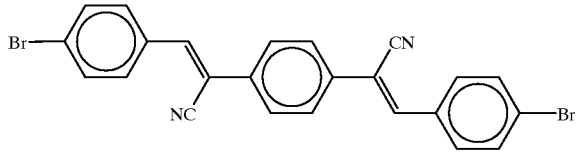

19

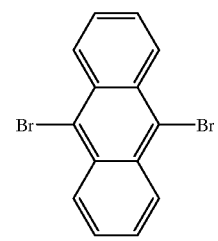

20

Monomers 2–5 and 11 are known compounds (see WO 97/33193 and U.S. Pat. No. 5,777,070), each of which are herein fully incorporated by reference, and monomer 20 is commercially available. Procedures for the preparation of other monomers used in the following examples are given below. AU compounds exhibit spectral data consistent with their structures.

General Procedure for the Preparation of 9,9-Disubstituted 2,7-Fluorene Diboronates (1)

To a stirred mixture of 9,9-disubstituted 2,7-dibromofluorene (10 mmol) and 50 mL of tetrahydrofuran (THF) under nitrogen at −78° C. was added dropwise a 2.5 M solution of n-butyllithium in hexanes (8 mL, 20 mmol) over 10 min. The di-lithio intermediate precipitated in a few minutes and the resulting colorless suspension was stirred at −78° C. for 1 hr. Tri-isopropylborate (7.5 g, 40 mmol) was added all at once, and the resulting slurry (additional 20–30 mL of THF added to facilitate agitation, in some cases) was stirred for 1 hr at −78° C., 16 hours at room temperature, and poured into 300 mL of ice-water containing 25 mL of conc. HCl. After stirring for 30 min, the product was extracted with 2×150 mL of diethyl ether. The ether extracts were washed with saturated aqueous sodium chloride solution (200 mL), dried (MgSO$_4$) and rotary evaporated to remove the solvent providing the diboronic acid as a semi-solid. The purity of the crude diboronic acid was assessed to be 85–95% depending upon the substrate by HPLC analysis and was converted to the diboronate without further purification, as described below.

The crude diboronic acid was suspended in 50 mL of toluene and 30 mmol (1.86 g) of ethylene glycol, and the mixture was stirred and refluxed under a Dean-Stark trap for 2–3 hr. During this time, about 25 mL of toluene was collected as over-head along with a small amount of water formed during the reaction as an azeotrope. The reaction mixture was cooled and the solvent was removed. The residue (semi-solid) was recrystallized from hexane or toluene-hexane mixture, depending upon the substrate, to provide the diboronate as colorless, amorphous powder in 70–85% overall yield. The purity, as judged by HPLC, was about 95–99%. Further recrystallization provided material of 99+% purity.

4,4'-Dibromo-1,4-distyrylbenzene (6)

To a stirred mixture of p-xylylenebis-(triphenylphosphonium bromide) (8.05 g, 10 mmol) and 4-bromobenzaldehyde (3.75 g, 20 mmol) in ethanol (100 mL) under nitrogen was added dropwise a solution of lithium ethoxide (1.0 M in ethanol, 21.5 mL, 21.5 mmol). The reaction was stirred at ambient temperature for 6 hours. The precipitate was filtered, washed with ethanol and dried. The crude product was redissolved in toluene, washed successively with aqueous hydrochloric acid (5%) and water and dried with magnesium sulfate. The solvent was evaporated under vacuum and the residue was recrystallized from toluene/methanol to afford 3.6 g (82%) of white solid. NMR indicated a trans-trans structure and the purity was found to be 100% as shown by HPLC.

4,4'-Dibromo-b,b'-diphenyl-1.4-distyrylbenzene (7)

To a stirred mixture of tetraethyl-o-xylylenediphosphonate (9.4 g, 25.0 mmol) and 4-bromobenzophenone (13.1 g, 50.0 mmol) in toluene was added potassium tert-butoxide (6.2 g. 55.0 mmol). The reaction was stirred at ambient temperature for 6 hours. The solution was filtered through a layer of celite. The solvent was evaporated under vacuum and the residue was recrystallized from toluene/hexane to give 5.8 g (39%) of light yellow solid material which was found to be a 1:4 mixture of the cis-trans and trans-trans isomers by HPLC.

1,2-Bis(4-bromophenyl)-1-phenylethylene (8)

To a stirred solution of 4-bromobenzophenone (5.22 g, 20 mmol) and diethyl-4-bromophenylphosphonate (6.8 g, 22 mmol) in 1,2-dimethoxyethane (60 mL) under nitrogen was added sodium hydride (0.52 g, 22 mmol) and the mixture was stirred and refluxed for 3 hours. After cooling, the mixture was poured into 150 g of ice water, the product was extracted with ether and purified by chromatography on silica gel. Elution with hexanes gave 6 grams (64% yield) of the title compound as a colorless oil which was found to be a 1:1 mixture of the cis and trans isomers.

3,3'-Dibromo-1,4-distyrylbenzene (9)

To a stirred mixture of p-xylylenebis-(triphenylphosphonium bromide) (15.8 g, 20 mmol) and 3-bromobenzaldehyde (7.4 g, 40.0 mmol) in ethanol (150 mL) under nitrogen was added dropwise a solution of lithium ethoxide (1.0 M in ethanol, 41.0 mL, 41.0 mmol). The reaction was stirred at ambient temperature for 8 hours. The precipitate was filtered, washed with ethanol and dried. The crude product was redissolved in toluene, washed successively with aqueous hydrochloric acid (5%) and water and dried with magnesium sulfate. The solvent was evaporated under vacuum and the residue was recrystallized from toluene/ethanol to afford 4.9 g (56%) of off-white solid. The purity was found to be >99% as shown by HPLC.

4,4'-Dibromo-1,3-distyrylbenzene (10)

To a stirred mixture of m-xylylenebis-(triphenylphosphonium bromide) (15.8 g, 20 mmol) and 4-bromobenzaldehyde (7.4 g, 40.0 mmol) in ethanol (200 mL) under nitrogen was added dropwise a solution of lithium ethoxide (1.0 M in ethanol, 41.0 mL, 41.0 mmol). The reaction was stirred at ambient temperature for 8 hours. The precipitate was filtered, washed with ethanol and dried. The crude product was redissolved in toluene, washed successively with aqueous hydrochloric acid (5%) and water and dried with magnesium sulfate. The solvent was evaporated under vacuum and the residue was recrystallized from toluene/ethanol to afford 3.8 g (43%) of yellow flakes which was found to be >99% in purity as shown by HPLC.

2,5-Di(4-bromophenyl)-2,1,3-benzothiadiazole (12)

A mixture of phenylboronic acid (17.6 g, 144.0 minmole), 4,7-dibromo-2,1,3-benzothiadiazole (21.0 g, 71.4 mmole), tetrakis(triphenylphosphine) palladium (180 mg, 0.156 mmol), Aliquat 336 (1.5 g), aqueous sodium carbonate (2 M, 100 mL) toluene (350 mL) was stirred and refluxed for 14 h under nitrogen. After cooling, the aqueous layer was separated, the organic layer was washed with water and dried. The solvent was removed and the residue was crystallized from toluene-ethanol give 11.4 g (55%) of the crystalline material.

To a stirred solution of above 2,5-diphenyl-2,1,3-benzothiadiazole (7.0 g, 30.6 mmol) in acetic acid (50 mL) was added dropwise bromine (13.7 g, 77.5 mmol). The reaction was stirred and refluxed for 8 hours. After cooling water (100 mL) was added and the reaction was allowed to stand at ambient temperature for 2 hours. The product was filtered, washed with water and dried. Recrystallized from toluene/ethanol afforded 9.3 g (68%) of yellow powder. The purity was found to be >98 % as shown by NMR and HPLC.

2,5-Di(4-bromonaphthyl)-2,1,3-benzothiadiazole (13)

To a stirred solution of 2,5-dinaphthalenyl-2,1,3-benzothiadiazole [Prepared from naphthylboronic acid and 4,7-dibromo-2,1,3-benzothiadiazole by the procedure described in (12) for the preparation of 2,5-diphenyl-2,1,3-benzothiadiazole] (9.9 g, 25.5 mmol) in 1,4-dioxane (80 mL) was added dropwise bromine (12.4 g, 77.5 mmol). The reaction was stirred and refluxed for 6 hours. After cooling ethanol (100 mL) was added and the reaction was allowed to stand at ambient temperature for 10 hours. The product was filtered and washed with ethanol. Recrystallized from toluene/ethanol gave 9.2 g (66%) of yellow flakes. The purity was found to be >95% as shown by NMR and HPLC.

4,7-Bis (5-bromo-2-thienyl)-2,1,3-benzothiadiazole (14)

4,7-Dithien-2-yl-2,1,3-benzothiadiazole [prepared by reacting 4,7-dibromo-2,1,3-benzothiadiazole with tributyl (thien-2-yl)stannane by following published procedure (Kitamura et al., Chem. Mater., Vol. 8, 1996, p. 570–578)] (7.7 g, 25.7 mmol) was dissolved in a mixture of chloroform (200 mL) and acetic acid (200 mL) under nitrogen and N-bromosuccinimide (9.61 g, 54 mmol) was added all at once. After stirring the reaction mixture at RT all night, the dark red precipitate was filtered off and recrystallized from DMF twice to provide the title compound as shiny, red crystals (6.85 g, 58.2%) which had a purity of 100% as shown by HPLC analysis.

2,5-Di(5'-bromofuranyl)-2,1,3-benzothiadiazole (15)

To a stirred solution of 2,5-difuranyl-2,1,3-benzothiadiazole [prepared by reacting 4,7-dibromo-2,1,3-benzothiadiazole with 2-(tributylstannyl)furan by following published procedure (Kitamura et al., Chem. Mater., Vol. 8, 1996, p. 570–578)](2.9 g, 10.1 mmol) in 1,4-dioxane (40 mL) was added dropwise bromine (3.6 g, 22.3 mmol). The reaction was stirred at ambient temperature for 5 minutes. The reaction was then diluted with water and the precipitate was filtered, washed with water and dried. The crude product was redissolved in toluene and chromatographed on a short alumina column. The solvent was evaporated under vacuum and the residue was recrystallized from toluene/ethanol to afford 3.0 g (70%) of red flakes which was found to be >99% in purity as shown by HPLC.

5,8-Dibromo-2,3-diphenylquinoxaline (16)

3,6-Dibromo-1,2-phenylenediamine (prepared by reduction of 4,7-dibromo-2,1,3-benzothiadiazole with zinc and acetic acid as reported by Naef and Balli (Helv. Chim. Acta, 1978, 61, 2959) (2 g, 8 mmol) and benzil (1.9 g, 9 mmol) were dissolved in 2-propanol (40 mL) and 5 drops of trifluoroacetic acid was added. The mixture was stirred and heated under reflux for 2 hr. On cooling, the pale yellow solid was filtered and recrystallized from ethanol to give 2.7 g (75%) of the title compound as colorless solid, mp 221–223° C.

4-Bromo-1-(4-bromophenyl)-3,5-diphenylpyrazole (17)

The title compound was obtained by the bromination of 1-(4-bromophenyl)-3,5-diphenylpyrazole (obtained by reacting dibenzoylmethane and 4-bromophenyl hydrazine in acetic acid) with N-bromosuccinimnide in DMF at 65° C. for 1 hr. The crude product was recrystallized from ethanol to provide the title compound as colorless powder in 72% yield and the purity was 100 % as shown by HPLC.

1,3-Bis(4-bromophenyl)-4-methyl-1H-pyrazolo[3,4-b]quinoline (18)

A mixture of 1,3-bis(4-bromophenyl)-pyrazolin-5-one (7.9 g, 20 mmol) and o-aminoacetophenone (2.7 g, 20 mmol) in 30 mL of ethylene glycol was heated and stirred at 180° C. under nitrogen for 22 hr. The dark red solution was cooled, 40 mL of ethanol added, refluxed for 1 hr and cooled. The yellow solid was filtered and recrystallized from toluene-hexane to provide 2.3 g (26% yield) of the title compound as yellow crystals. The purity was found to be 100% as shown by HPLC.

a,a-Bis(4-bromophenylmethylene)-1,4-benzenediacetonitrile (19)

A mixture of 4-bromobenzaldehyde (24.0 g, 0.13 mole), phenylene-1,4-diacetonitrile (10.0 g, 0.064 mole), piperidine (5 mL), and ethanol (150 mL) was refluxed for 3 h and the mixture allowed to stand overnight at room temperature. The orange crystalline solid was filtered and washed three times with ethanol (200 mL) and dried to give 15.3 g (50%) of the desired product. The $^1$H nmr spectrum is consistent with the structure of the desired product. Recrystallization from DMF provided a very pure product for polymerization.

The copolymers of the invention were prepared by the procedure of U.S. Pat. No. 5,777,070 except those involving monomer 14 which required THF as a cosolvent. The structures and monomeric reactants of the exemplified copolymers are given in Table 1; the properties of copolymers are given in Table 2.

TABLE 1

Compositions of Fluorene Copolymers.

| Copolymer | Copolymer Empirical Formula[A] | Monomer (mmoles) | Monomer (mmoles) | Monomer (mmoles) | Monomer (mmoles) |
|---|---|---|---|---|---|
| 1 | -[(1c)$_{35}$-(3a)$_2$-(4b)$_3$]$_n$- | 1c (10.2) | 2c (7.5) | 3a (1.0) | 4b (1.5) |
| 2 | -[(1c)$_{20}$-(11)$_{17}$-(20)$_3$]$_n$- | 1c (10.2) | 11 (8.5) | 20 (1.5) | |
| 3 | -[(1c)$_2$-(11)$_1$-(3a)$_1$]$_n$- | 1c (8.2) | 11 (4.0) | 3a (4.0) | |
| 4 | -[(1b)$_3$-(11)$_2$-(3a)$_1$]$_n$- | 1b (12.3) | 11 (8.0) | 3a (4.0) | |
| 5 | -[(1b)$_4$-(11)$_3$-(3a)$_1$]$_n$- | 1b (12.3) | 11 (9.0) | 3a (3.0) | |
| 6 | -[(1b)$_3$-(11)$_1$-(3b)$_2$]$_n$- | 1b (12.3) | 11 (4.0) | 3b (8.0) | |
| 7 | -[(1b)$_2$-(12)$_1$-(3a)$_1$]$_n$- | 1b (10.2) | 12 (5.0) | 3a (5.0) | |
| 8 | -[(1b)$_2$-(13)$_1$-(3a)$_1$]$_n$- | 1b (8.2) | 13 (4.0) | 3a (4.0) | |
| 9 | -[(1b)$_{34}$-(5)$_5$-(11)$_1$]$_n$- | 1b (10.2) | 2b (7.0) | 5 (2.5) | 11 (0.5) |
| 10 | -[(1c)$_2$-(16)$_1$-(3a)$_1$]$_n$- | 1c (3.5) | 16 (1.7) | 3a (1.7) | |
| 11 | -[(1c)$_{10}$-(2c)$_5$-(20)$_3$-(4b)$_2$]$_n$- | 1c (10.2) | 2c (5.0) | 20 (3.0) | 4b (2.0) |

TABLE 1-continued

Compositions of Fluorene Copolymers.

| Copolymer | Copolymer Empirical Formula[A] | Monomer (mmoles) | Monomer (mmoles) | Monomer (mmoles) | Monomer (mmoles) |
|---|---|---|---|---|---|
| 12 | -[(1b)$_{15}$-(3a)$_2$-(20)$_3$]$_n$- | 1b (10.2) | 2b (5.0) | 3a (2.0) | 20 (3.0) |
| 13 | -[(1f)$_3$-(1c)$_2$-(19)$_1$]$_n$- | 1f (3.0) | 2c (2.0) | 19 (1.0) | |
| 14 | -[(1c)$_{19}$-(19)$_1$]$_n$- | 1c (4.0) | 2c (3.6) | 19 (0.4) | |
| 15 | -[(1c)$_{39}$-(19)$_1$]$_n$- | 1c (4.0) | 2c (3.8) | 19 (0.2) | |
| 16 | -[(1f)2-(1d)1-(1e)1-(19)2]$_n$- | 1f (2.1) | 1d (1.0) | 2c (1.0) | 19 (2.0) |
| 17 | -[(1c)1-(18)1]$_n$- | 1c (4.1) | 18 (4.0) | | |
| 18 | -[(1c)19-(17)1]$_n$- | 1c (8.2) | 17 (8.0) | | |
| 19 | -[(1c)$_{10}$-(11)$_9$-(14)$_1$]$_n$- | 1c (8.2) | 11 (7.2) | 14 (0.8) | |
| 20 | -[(1c)$_4$-(11)$_3$-(14)$_1$]$_n$- | 1c (5.2) | 11 (3.8) | 14 (1.2) | |
| 21 | -[(1e)$_2$-(11)$_1$-(14)$_1$]$_n$- | 1e (2.6) | 11 (1.3) | 14 (1.3) | |
| 22 | -[(1c)$_{100}$-(11)$_{97}$-(14)$_3$]$_n$- | 1c (8.2) | 11 (7.8) | 14 (0.2) | |
| 23 | -[(1c)$_{20}$-(11)$_{17}$-(14)$_3$]$_n$- | 1c (6.2) | 11 (5.1) | 14 (0.9) | |
| 24 | -[(1c)$_7$-(11)$_2$-(14)$_1$]$_n$- | 1c (5.1) | 2b (2.0) | 11 (2.0) | 14 (1.0) |
| 25 | -[(1c)$_{10}$-(11)$_1$-(15)$_1$]$_n$- | 1c (10.3) | 15 (1.0) | 11 (9.0) | |
| 26 | -[(1c)$_1$-(8)$_1$]$_n$- | 1c (11.0) | 8 (10.8) | | |
| 27 | -[(1c)$_1$-(6)$_1$]$_n$- | 1c (10.3) | 6 (10.0) | | |
| 28 | -[(1d)$_1$-(6)$_1$]$_n$- | 1d (10.3) | 6 (10.0) | | |
| 29 | -[(1c)$_1$-(10)$_1$]$_n$- | 1c (10.3) | 10 (10.0) | | |
| 30 | -[(1c)$_1$-(9)$_1$]$_n$- | 1c (10.3) | 9 (10.0) | | |
| 31 | -[(1c)$_1$-(7)$_1$]$_n$- | 1c (9.9) | 7 (9.6) | | |
| 32 | -[(1c)$_{10}$-(2b)$_7$-(20)$_3$]$_n$- | 1c (10.2) | 2c (7.0) | 20 (3.0) | |

[hu ABold type numerals in copolymer empirical formulas refer to RMUs of the corresponding monomers.

TABLE 2

Properties of Fluorene Copolymers.

| Co-polymer | $T_g$ (° C.) | Inherent Viscosity | Absorption[A] (nm) | Fluorescence[B] (mn) | Bandgap (eV) |
|---|---|---|---|---|---|
| 1 | — | 1.50 | 383 | 467 | |
| 2 | 108 | 1.33 | 323 462 | 535 | |
| 3 | 100 | 1.27 C | 346, 384 459 | 535 | |
| 4 | 108 | 0.95 D | 339, 393 466 | 545 | |
| 5 | 125 | 1.18 | 320, 339 461 | 550 | |
| 6 | 140 | 0.52 | 336, 383 450 | 558 | |
| 7 | 195 | 3.00 | 352 | 544 | |
| 8 | 201 | 1.10 | 348 383 | 524 | |
| 9 | 136 | 1.70 | 381 | 531 | |
| 10 | 125 | 0.52 | 342 389 | 507 | |
| 11 | 81 | 1.00 | 388 | 480 | |
| 12 | — | 0.45 | 383 | 431 | 2.89 |
| 13 | 131 | 0.57 | 390 | 500 | |
| 14 | 108 | 0.78 | 390 | 510 | 2.62 |
| 15 | 97 | 0.85 | 390 | 510 | 2.71 |
| 16 | 102 | 0.94 | 420 | 515 | 2.52 |
| 17 | — | 0.95 | 355 | 497 | |
| 18 | — | 0.21 | 347 | 420 525 | |
| 19 | 120 | 1.82 | 322, 467 560 | 642 | 2.10 |
| 20 | 132 | 1.25 | 341, 474 550 | 639 | |
| 21 | 105 | 1.41 | 389, 460 570 | 659 | |
| 22 | 103 | 1.43 | 322 465 | 666 | |
| 23 | 125 | 1.24 | 320, 470 556 | 646 | |

TABLE 2-continued

Properties of Fluorene Copolymers.

| Co-polymer | $T_g$ (° C.) | Inherent Viscosity | Absorption[A] (nm) | Fluorescence[B] (mn) | Bandgap (eV) |
|---|---|---|---|---|---|
| 24 | 112 | 1.15 | 383, 463 550 | 639 | |
| 25 | 119 | 1.1 | 325 339 | 630 | |
| 26 | 82 | 0.31 | 375 | 441 470 | |
| 27 | 135 | 0.55 | 373 | 456 483 | 2.76 |
| 28 | 134 | 0.33 | 388 | 440 475 | 2.75 |
| 29 | 101 | 0.23 | 359 | 433 | 2.95 |
| 30 | 92 | 0.25 | 335 | 428 | 3.20 |
| 31 | 134 | 0.30 | 381 | 492 | 2.68 |
| 32 | 130 | 1.73 | 384 | 440 | |

[A]Absorption peaks of copolymer films
[B]Fluorescence peaks of copolymer films
C Weight-average molecular weight 97,000 by light scattering
D Weight-average molecular weight 53,000 by light scattering.

Light Emitting Diodes (LED)

ITO-coated glass with sheet resistance of about 15 ohms/square was used as substrate for diode fabrication. The ITO side of the substrate was treated with a 100 nm coating of Baytron P™ (a conducting polymer available from Bayer A. G.) diluted with either equal part or two parts of poly (styrenesulfonic acid). The conducting polymer film was dried at 200° C. in air for about 5 minutes and was then coated with an light emitting polymer film by spin-coating with solutions of polymers in xylene. The light emitting polymer film was then dried in a nitrogen atmosphere at 90° C. for at least two hours. Onto the light emitting polymer film was then deposited a calcium cathode (about 75–100 nm). The finished device was connected to a power source, in an inert atmosphere, with ITO being the positive electrode. Luminance of emitted light and density of current flowing through the diode were monitored as a function of applied voltage. Luminance is expressed in unit of $Cd/m^2$, and efficiency expressed as lumens/watt (L/W): L/W=p (Cd/A)/V where A and V are respectively the current and voltage for a given brightness.

Green LEDs

Table 3 lists the compositions and voltages and efficiency at 4000 $Cd/m^2$ of 3 green LEDs, two of which contain copolymers of the invention. Green 1 and Green 2, of approximately the same performance, reaching luminance of 4000 $Cd/m^2$ at lower voltage and higher efficiency than the comparative LED which does not contain copolymer of the invention. The copolymer of the comparative example differs from copolymers 4 and 5 in the absence of a hole transporting RMU, thus illustrating the advantage of achieving a balance in hole and electron transport properties. Note the same benefit is realized in the blend (Green 2) containing a copolymer of the invention.

TABLE 3

Green LEDs

4000 $Cd/m^2$

| Example | Copolymer Film: Structure[A] | Volts | L/W |
|---|---|---|---|
| Green 1 | 100 nm copolymer 5: -[(1b)$_4$-(11)$_3$-3a]- | 3.9 | 2.36 |
| Comparative | 100 nm comparative copolymer: -[1b-11]- | 6.3 | 0.56 |
| Green 2 | 75 nm blend of 30 weight % comparative copolymer in copolymer 4. Comparative copolymer: -[1b-11]- Copolymer 4: -[(1b)$_3$-(11)$_2$-3a]- | 3.7 | 2.65 |

[A]Bold type numerals in copolymer empirical formulas refer to RMUs of the corresponding monomers.

Red LEDs

Table 4 lists two LEDs that emit red light. Red 1 is based on a single copolymer while Red 2 is based on a blend of two copolymers of the invention. The marked improvement in device performance noted in Red 2 over Red 1 demonstrates the advantages of using polymer blends.

TABLE 4

Red LEDs

1000 $Cd/m^2$

| Example | Copolymer Film: Structure[A] | Volts | L/W |
|---|---|---|---|
| Red 1 | 75 nm copolymer 19: -[(1c)$_{10}$-(11)$_9$-14]- | 9.0 | 0.12 |
| Red 2 | 75 nm blend of 30 weight % copolymer 19 in copolymer 5. | 5.0 | 0.41 |

[A]Bold type numerals in copolymer empirical formulas refer to RMUs of the corresponding monomers.

White LED

Two white LEDs each based on a 100 nm film of a blend containing copolymer 22 of the invention in a mixture of fluorene copolymers not of this invention (hereinafter referred to as comparative mixture). The comparative mixture is a blend of 15 weight % of fluorene copolymer -[1c–4a]-
7 weight % of fluorene copolymer -[1c–3a]-
78 weight % of fluorene homopolymer -[1c]-

The amount of copolymer 22 and LED performance are provided in Table 5. The comparative mixture without copolymer 22 is a blue light emitter and the addition of 1 weight % or less of copolymer 22 of the invention converts the blend into a white light emitter. This example illustrates the impact an extremely small amount of a copolymer of the invention can have on LEDs.

TABLE 5

White LEDs

1500 $Cd/m^2$

| Example | Copolymer of invention in blend[A] | Volts | L/W |
|---|---|---|---|
| White 1 | 0.5 weight % copolymer 22, -[(1c)$_{100}$-(14)$_3$]-, in blend | 10.8 | 0.2 |
| White 2 | 1.0 weight % copolymer 22, -[(1c)$_{100}$-(14)$_3$]-, in blend | 8.9 | 0.3 |

[A]Bold type numerals in copolymer empirical formulas refer to RMUs of the corresponding monomers.

What is claimed is:

1. A conjugated copolymer comprising monomeric units wherein
    (a) at least 15 percent of the monomeric units are derived from monomers selected from the group consisting of 9-substituted fluorene monomers, 9,9-disubstituted fluorene monomers or combinations thereof; and (b) at least 10 percent of the monomeric units comprise two distinct residual monomeric units that have hole transporting properties, wherein at least one of said residual monomeric units having hole transporting properties is derived from a compound selected from the group consisting of N,N,N',N'-tetraarylbenzidines, N-substituted-carbazoles, diarylsilanes, thiophenes without electron-withdrawing substituents, furans without electron-withdrawing substituents, pyrroles without electron-withdrawing substituents, stilbenes without electron-withdrawing substituents, and 1,4-dienes without electron-withdrawing substituents.

2. A conjugated copolymer comprising monomeric wherein (a) at least 10 percent of the monomeric units are derived from monomers selected from the group consisting of 9-substituted fluorene monomers, 9,9-disubstituted fluorene monomers or combinations thereof, and (b) at least 1 percent of the monomeric units comprising two other residual monomeric units which are different from each other but which both comprise delocalized π-electrons; the other residual monomeric units being independently selected from the group consisting of residual monomeric units that have hole transporting properties and residual monomeric units that have electron transporting properties; wherein if both of the two other residual monomeric units have hole transporting properties, then at least one of said residual monomeric units is derived from N,N,N',N'-tetraarylbenzidines, N-substituted-carbazoles, diarylsilanes, thiophenes without electron-withdrawing substituents, furans without electron-withdrawing substituents, pyrroles without electron-withdrawing substituents, stilbenes without electron-withdrawing substituents, and 1,4-dienes without electron-withdrawing substituents, and neither of the two other residual monomeric units is anthracene.

3. A conjugated polymer comprising at least three types of monomeric units which are different from each other wherein (a) a first monomeric unit is derived from monomers selected from the group consisting of 9-substituted fluorene monomers and 9,9-disubstituted fluorene monomers and comprises at least 10 percent of the monomeric units in the polymer, (b) a second monomeric unit and a third monomeric unit each comprise delocalized π-electrons and are independently selected from the group consisting of residual monomeric units that have hole transporting properties and residual monomeric units that have electron transporting properties; wherein if both of the second and third monomeric units have hole transporting properties, then at least one of said units is derived from N,N,N',N'-tetraarylbenzidines, N-substituted-carbazoles, diarylsilanes, thiophenes without electron-withdrawing substituents, furans without electron-withdrawing substituents, pyrroles without electron-withdrawing substituents, stilbenes without electron-withdrawing substituents, and 1,4-dienes without electron-withdrawing substituents, wherein the polymer is characterized in that at least one of the first, second or third monomeric units cannot be bonded to itself.

4. The polymer of claim 3 wherein the first monomeric unit is selected from group having the formulas:

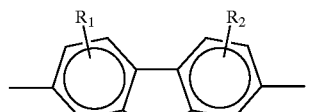

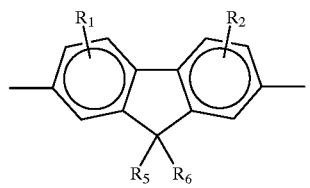

wherein, $R_1$ and $R_2$ are independently in each occurrence hydrogen, $C_{1-20}$ hydrocarbyl, $C_{1-20}$ hydrocarbyloxy, $C_{1-20}$ thiohydrocarbyloxy, or cyano;

$R_3$ and $R_4$ are independently in each occurrence a hydrogen, a $C_{1-20}$ hydrocarbyl, a $C_{6-20}$ aryl; or $R_3$ and $R_4$ form $C_{3-12}$ cyclic structures with the olefin carbon to which they are attached;

$R_5$ and $R_6$ are independently in each occurrence a hydrogen, $C_{1-20}$ hydrocarbyl, a $C_{6-20}$ aryl, or $R_5$ and $R_6$ form $C_{3-12}$ cyclic structures with the C-9 carbon of fluorene.

5. The polymer of claim 3 wherein the second and third monomeric units have electron transporting properties and together comprise at least 10% of the monomeric units in the polymer.

6. The polymer of claim 3 wherein the second monomeric unit comprises hole transporting moieties and the third monomeric unit comprises electron transporting moieties.

7. A conjugated polymer which is the reaction product of at least three monomers comprising

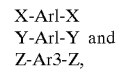

X-Ar1-X
Y-Ar1-Y and
Z-Ar3-Z, wherein Ar1 is a fluorene, Ar2 is an aromatic group having Y connected directly to an aromatic ring and Ar2 has hole transporting properties, electron transporting properties or is selected from benzene, naphthalene, and biphenylene, Ar3 is a pi-conjugated aromatic group having Z connected directly to an aromatic ring and has hole transporting or electron transporting properties, X, Y, and Z are selected from halides, boronic acids and boronate esters wherein the number of halide groups is approximately equal to the number of boronic acid and boronate ester groups.

8. A film comprising the polymer of claim 3.

9. A conjugated polymer comprising the following monomeric units:

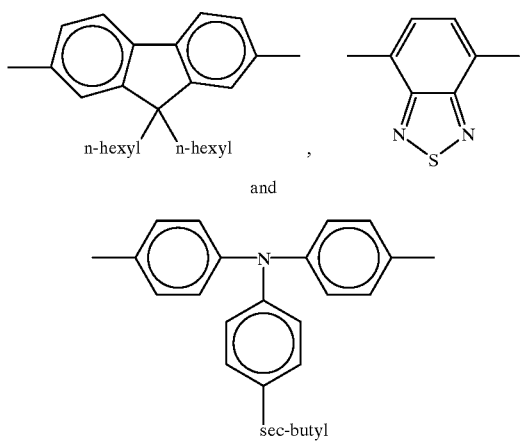

and

10. A polymer comprising the following monomeric units

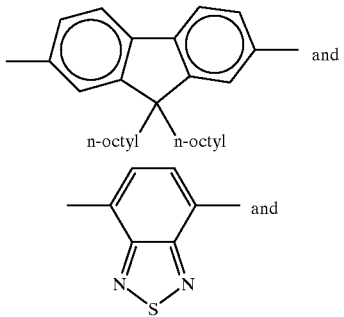

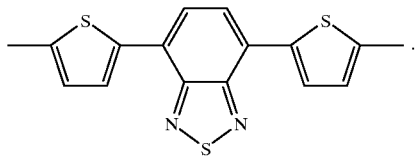

11. The polymer of claim 3 wherein none of the first, second, and third repeat units are bonded to itself.

12. A copolymer comprising monomeric units wherein
(a) at least 10% of the monomeric units are derived from monomers selected from the group consisting of 9-substituted fluorene monomers, 9,9-disubstituted fluorene monomers or combinations thereof, and
(b) at least 1% of the monomeric units comprising two other residual monomeric units which are different from each other but which both comprise delocalized π-electrons; the other residual monomeric units being a independently selected from the group consisting of residual monomeric units that have hole transporting properties and residual monomeric units that have electron transporting properties, wherein if both of the two other residual monomeric units have hole transporting properties, then at least one of said residual monomeric units is derived from stilbenes without electron-withdrawing substituents, 1,4-dienes without electron-withdrawing substituents, thiophenes without electron-withdrawing substituents, furans without electron-withdrawing, substituents, pyrroles without electron withdrawing substitutents, N,N,N',N'-tetraarylbenzidines,N-substituted-carbazoles, and diarylsilanes.

* * * * *